(12) United States Patent
Knapp

(10) Patent No.: US 10,198,543 B2
(45) Date of Patent: Feb. 5, 2019

(54) SUB-MODULE PHYSICAL REFINEMENT FLOW

(71) Applicant: Synopsys, Inc., Mountain View, CA (US)

(72) Inventor: Kevin Knapp, Maryville, TN (US)

(73) Assignee: SYNOPSYS, INC., Mountain View, CA (US)

( * ) Notice: Subject to any disclaimer, the term of this patent is extended or adjusted under 35 U.S.C. 154(b) by 0 days.

(21) Appl. No.: 14/852,875

(22) Filed: Sep. 14, 2015

(65) Prior Publication Data

US 2015/0379165 A1 Dec. 31, 2015

Related U.S. Application Data

(63) Continuation of application No. 14/254,143, filed on Apr. 16, 2014, now Pat. No. 9,152,754.

(60) Provisional application No. 61/820,516, filed on May 7, 2013.

(51) Int. Cl.
*G06F 17/50* (2006.01)

(52) U.S. Cl.
CPC ........ *G06F 17/505* (2013.01); *G06F 17/5068* (2013.01)

(58) Field of Classification Search
USPC ........................................................ 716/104
See application file for complete search history.

(56) References Cited

U.S. PATENT DOCUMENTS

| 9,152,754 | B2 * | 10/2015 | Knapp | G06F 17/505 |
| 2003/0084416 | A1 * | 5/2003 | Dai | G06F 17/5045 716/55 |
| 2007/0150846 | A1 * | 6/2007 | Furnish | G06F 17/5068 716/122 |
| 2008/0282212 | A1 | 11/2008 | Dennison et al. | |
| 2009/0235219 | A1 | 9/2009 | Lin et al. | |
| 2010/0100861 | A1 * | 4/2010 | Frederick | G06F 17/5068 716/119 |
| 2010/0306729 | A1 * | 12/2010 | Ginetti | G06F 17/5068 716/124 |
| 2011/0302545 | A1 * | 12/2011 | Alpert | G06F 17/5072 716/126 |
| 2012/0036491 | A1 * | 2/2012 | Ramji | G06F 17/5072 716/122 |
| 2013/0212547 | A1 * | 8/2013 | Cheng | G06F 17/5072 716/111 |

(Continued)

OTHER PUBLICATIONS

U.S. Appl. No. 14/254,143, Non-Final Office Action dated Nov. 6, 2014.

(Continued)

*Primary Examiner* — Mohammed Alam
(74) *Attorney, Agent, or Firm* — Alston & Bird LLP

(57) ABSTRACT

A computer system is provided that enables a designer of a circuit design to fracture and reconstitute a larger design for both computer modeling of the functionality and the physical implementation or rendering of the circuit design. More particularly, the designer may refine or re-work a sub-module of the larger sub-circuit without having to create a corresponding sub-module in the physical implementation. This capability thus avoids the significant complexity required for sub-module refinement in the current state of the art, and provides the designer with a much simpler flow.

10 Claims, 14 Drawing Sheets

(56) References Cited

U.S. PATENT DOCUMENTS

2015/0379165 A1* 12/2015 Knapp ................ G06F 17/5068
716/104

OTHER PUBLICATIONS

U.S. Appl. No. 14/254,143, Notice of Allowance dated Apr. 29, 2015.
U.S. Appl. No. 14/254,143, Requirement for Restriction/Election dated Jul. 7, 2014.
U.S. Appl. No. 61/820,516, filed May 7, 2013, Expired.

* cited by examiner

SUB-MODULE PHYSICAL REFINEMENT FLOW

This application is a Continuation of U.S. application Ser. No. 14/254,143, entitled "SUB-MODULE PHYSICAL REFINEMENT FLOW", filed Apr. 16, 2014, which Application claims the benefit of priority under 35 U.S.C. § 119(e) to U.S. Provisional Application No. 61/820,516, entitled "SUB-MODULE PHYSICAL REFINEMENT FLOW", filed May 7, 2013, the contents of which are incorporated herein by reference in their entirety.

FIELD OF THE INVENTION

The present disclosure relates to electronic-design-automation (EDA) techniques. More specifically, the present disclosure relates to a technique for sub-module physical refinement in the absence of specific physical hierarchy.

RELATED ART

As semiconductor technology is scaled to ever smaller dimensions, there are commensurate increases in the complexity of digital circuit designs. For example, smaller dimensions typically result in digital circuit designs having an increased number of logic gates and time domains. Moreover, this increase in complexity typically results in a significant increase in the time and cost needed to design and implement digital circuits.

Digital circuit design fundamentally has two components: abstraction of the functionality of the circuit via computer models, and the actual physical rendering and implementation of the design. The development of any given design progresses from one phase to the next; from functional abstraction via computer modeling to physical rendering. In this progression, there becomes a point where the lines between the two are blurred. Aspects of the physical implementation have to be accounted for in the functional computer modeling; and functional aspects of the circuit have to be accounted for in the physical implementation.

In addition, given today's designs that can be very large and complex, there is a need to break the larger design into smaller sub-circuits that are more easily handled. These sub-circuits are then put together to accomplish the larger design. This fracturing and reconstitution of the larger design applies in both the computer modeling of the functionality and the physical implementation or rendering.

As the number of sub-circuits increases so does the complexity of the process of fracturing and reconstitution. Thus, it is desirable to limit the number of sub-circuits. Accordingly, the sub-circuits themselves can be quite complex.

At the point where the lines between the two phases of the design process blur, the current state of the art requires that there be a one-to-one correspondence between the sub-circuits of the functional modeling and the sub-circuits of the physical implementation.

This need for one-to-one correspondence often causes difficulties and inefficiencies for the designer. For example, the designer may need to change or successively refine a small portion of the sub-circuit in the functional model, but cannot do so because there is no corresponding physical sub-circuit for the portion he desires to change. Accordingly, the designer working on the computer modeling of the functionality is forced to rebuild the entire sub-circuit resulting in inefficiencies of build time and the possible introduction of additional problems and errors. Circuit designers need a way to rebuild and physically refine only a desired portion of a given sub-circuit.

Hence, there is a need for an EDA technique to provide this capability. That is, there is a need to be able to perform physical synthesis on a sub-module of a circuit design for which no physical hierarchy is defined that eliminates the need to resynthesize the larger circuit and thereby improve efficiency while avoiding the possible introduction of errors and creation of other problems.

BRIEF SUMMARY OF THE INVENTION

The following portion of this disclosure presents a simplified summary of one or more innovations, embodiments, and/or examples found within this disclosure for at least the purpose of providing a basic understanding of the subject matter. This summary does not attempt to provide an extensive overview of any particular embodiment or example. Additionally, this summary is not intended to identify key/critical elements of an embodiment or example or to delineate the scope of the subject matter of this disclosure. Accordingly, one purpose of this summary may be to present some innovations, embodiments, and/or examples found within this disclosure in a simplified form as a prelude to a more detailed description presented later.

One embodiment of this disclosure provides a computer system that enables the designer of a circuit design to fracture and reconstitute a larger design for both the computer modeling of the functionality and the physical implementation or rendering of the circuit design. More particularly, the designer may refine or re-work a sub-module of the larger sub-circuit without having to create a corresponding sub-module in the physical implementation. This capability thus avoids the significant complexity required for sub-module refinement in the current state of the art, and provides the designer with a much simpler flow.

The present invention enables the designer to leave the rest of the sub-circuit untouched because only the targeted sub-module need be changed. This greatly reduces the risk of introducing additional problems and errors by eliminating the need to rebuild the entire sub-circuit. The re-work of the targeted sub-module is done while accounting for the context that the sub-circuit provides to the sub-module, both in terms of functional modeling and physical implementation. This contextual representation helps to ensure seamless integration of the refined sub-module back into the sub-circuit.

Since only the sub-module is being refined in this process, the time to assess each potential refinement is greatly reduced. The benefit of this reduction is realized with each iteration and is thus compounded, greatly improving the designer's efficiency and time required to achieve optimal results.

There are multiple reasons why a designer may want to change or refine only a portion of a sub-circuit. Fundamentally these reasons boil down to functional or physical changes to the design. Functional or physical changes, in turn, may occur due to specification changes or resolution of problems identified as functional and/or physical modeling is refined to account for additional aspects of the overall design. These problems may be identified much later in the development progression, yet may require changes at earlier stages leading to necessary rework of a portion of the design. Under these conditions, it is desirable to limit the scope and extent of the rework. Accordingly, this invention may then also serve as a means to accomplish these targeted changes while leaving the rest of the design untouched, thereby garnering the benefits described earlier herein.

A further understanding of the nature of and equivalents to the subject matter of this disclosure (as well as any inherent or express advantages and improvements provided) should be realized in addition to the above section by reference to the remaining portions of this disclosure, any accompanying drawings, and the claims.

BRIEF DESCRIPTION OF THE DRAWINGS

In order to reasonably describe and illustrate those innovations, embodiments, and/or examples found within this disclosure, reference may be made to one or more accompanying drawings. The additional details or examples used to describe the one or more accompanying drawings should not be considered as limitations to the scope of any of the claimed inventions, any of the presently described embodiments and/or examples, or the presently understood best mode of any innovations presented within this disclosure.

DETAILED DESCRIPTION OF THE INVENTION

The following description is presented to enable any person skilled in the art to make and use the disclosure, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present disclosure is not intended to be limited to the embodiments shown, but is to be accorded the widest scope consistent with the principles and features disclosed herein.

Embodiments of a computer system, a method, a graphical user interface and a computer-program product (i.e., software) for use with the computer system are described. A circuit designer may use these systems, devices, and/or techniques to configure and monitor the execution of tasks in a user-configurable electronic-design-automation (EDA) flow associated with a circuit or circuit design. In particular, using an intuitive and interactive graphical user interface in EDA software, the circuit designer can configure and initiate execution of the EDA flow. Then, during execution of EDA tasks in the EDA flow, an execution monitor in the graphical user interface may provide a graphical representation of real-time execution status information for the EDA tasks. Moreover, using the EDA software, the circuit designer can debug the circuit design if any errors or problems occur.

By providing real-time feedback on progress and any problems, these devices and techniques can improve: project visibility, productivity and/or predictability. For example, using these devices and techniques, chip designers can design circuits or chips that are manufacturing ready in a single-pass design cycle. Consequently, these devices and techniques may make it easier for chip designers to design circuits or chips, which can decrease the time and cost of circuit or chip design, thereby increasing customer satisfaction and retention.

Figure 1:
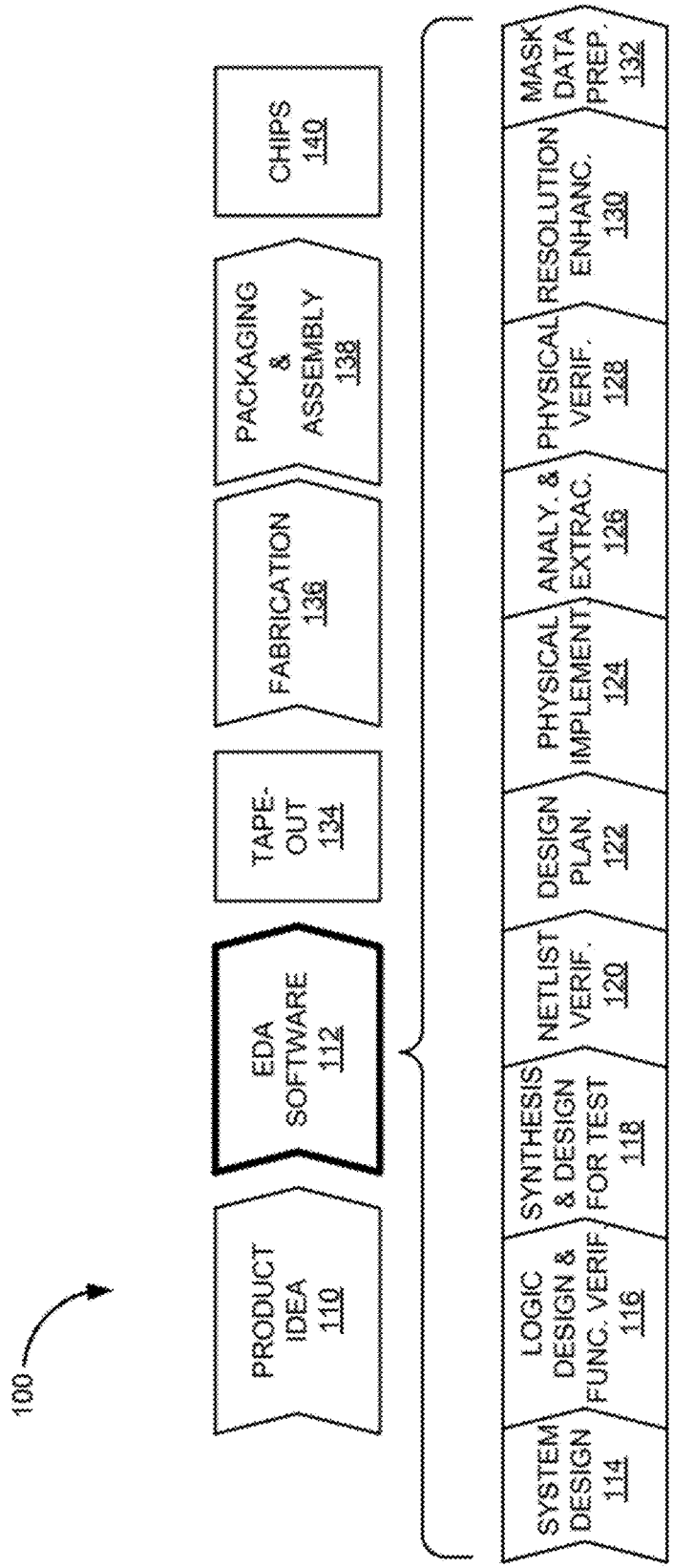
FIG. 1 is a flowchart illustrating various operations in the design and fabrication of an integrated circuit in accordance with an embodiment of the present disclosure.

Embodiments of design and fabrication of integrated circuits or chips are now described with reference to FIG. 1. FIG. 1 is flowchart 100 illustrating the various operations in the design and fabrication of an integrated circuit. This process starts with the generation of a product idea (110), which is realized during a design process that uses electronic design automation (EDA) software (112). When the design is finalized, it can be taped-out (134). After tape-out, a semiconductor die is fabricated (136) and packaging and assembly processes (138) are performed, which ultimately result in finished chips (140).

Note that the design process that uses EDA software (112) includes operations 114-132, which are described below. This design flow description is for illustration purposes only. In particular, this description is not meant to limit the present disclosure. For example, an actual integrated circuit design may require a designer to perform the design operations in a different sequence than the sequence described herein.

During system design (114), designers describe the functionality to implement. They can also perform what-if planning to refine the functionality and to check costs. Note that hardware-software architecture partitioning can occur at this stage. Exemplary EDA software products from Synopsys, Inc. of Mountain View, Calif. that can be used at this stage include: Model Architect.RTM., Saber, System Studio.RTM., and Designware.RTM. products.

Then, during logic design and functional verification (116), VHDL or Verilog code for modules in the circuit is written and the design is checked for functional accuracy. More specifically, the design is checked to ensure that it produces the correct outputs. Exemplary EDA software products from Synopsys, Inc. of Mountain View, Calif. that can be used at this stage include: VCS.RTM., Vera.RTM., Designware.RTM., Magellan.RTM., Formality.RTM., ESP.RTM. and Leda.RTM. products.

Next, during synthesis and design for test (118), VHDL/Verilog is translated to a netlist. This netlist can be optimized for the target technology. Additionally, tests can be designed and implemented to check the finished chips. Exemplary EDA software products from Synopsys, Inc. of Mountain View, Calif. that can be used at this stage include: Design Compiler.RTM., Physical Compiler.RTM., Test Compiler.RTM., Power Compiler.RTM., FPGA Compiler.RTM., Tetramax.RTM., and Designware.RTM. products.

Moreover, during netlist verification (120), the netlist is checked for compliance with timing constraints and for correspondence with the VHDL/Verilog source code. Exemplary EDA software products from Synopsys, Inc. of Mountain View, Calif. that can be used at this stage include: Formality.RTM., Primetime.RTM., and VCS.RTM. products.

Furthermore, during design planning (122), an overall floor plan for the chip is constructed and analyzed for timing and top-level routing. Exemplary EDA software products from Synopsys, Inc. of Mountain View, Calif. that can be used at this stage include: Astro.RTM. and IC Compiler.RTM. products.

Additionally, during physical implementation (124), the placement (positioning of circuit elements) and routing (connection of the same) occurs. Exemplary EDA software products from Synopsys, Inc. of Mountain View, Calif. that can be used at this stage include: the Astro.RTM. and IC Compiler.RTM. products.

Then, during analysis and extraction (126), the circuit function is verified at a transistor level, which permits refinement. Exemplary EDA software products from Synopsys, Inc. of Mountain View, Calif. that can be used at this stage include: Astrorail.RTM., Primerail.RTM., Primetime.RTM., and Star RC/XT.RTM. products.

Next, during physical verification (128), the design is checked to ensure correctness for: manufacturing, electrical issues, lithographic issues, and circuitry. Exemplary EDA software products from Synopsys, Inc. of Mountain View, Calif. that can be used at this stage include the Hercules.RTM. product.

Moreover, during resolution enhancement (130), geometric manipulations of the layout are performed to improve manufacturability of the design. Exemplary EDA software products from Synopsys, Inc. of Mountain View, Calif. that can be used at this stage include: Proteus.RTM., Proteus.RTM.AF, and PSMGED.RTM. products.

Additionally, during mask-data preparation (132), the 'tape-out' data for production of masks to produce finished chips is provided. Exemplary EDA software products from Synopsys, Inc. of Mountain View, Calif. that can be used at this stage include the CATS.RTM. family of products.

Embodiments of the present disclosure can be used during one or more of the above-described stages. Specifically, in some embodiments the present disclosure can be used in EDA software that includes operations between design (114) and resolution enhancement (130).

We now describe embodiments of a technique for design portion of the EDA flow. EDA software may provide interactive flow-control environment that includes EDA tools, utilities and automation which allow a user (such as a chip designer) to design a circuit or a chip, including: layout, node optimization, and EDA flows that include multiple EDA tasks or tool scripts. These EDA flows may include block-level flows and full-chip hierarchical flows, which act on a circuit or chip design (which is henceforth referred to as a circuit design).

To accelerate circuit development using the EDA software, the user may use a variety of preconfigured or pre-defined content, including EDA tool scripts with default technology settings and/or default flows associated with blocks in the circuit design. However, the EDA software also supports user-defined technology settings and block configurations (i.e., the EDA software is programmable).

In general, a particular design may be specified by a corresponding user-configurable EDA flow, which includes a sequence of blocks having associated block flows and sub-block or step flows. A given block in the sequence of blocks may include one or more sub-block flows, and a given sub-block in the sub-block flow may represent a sequence of EDA tasks that are performed on a circuit design.

In the discussion that follows, an EDA task is defined as an EDA tool script that performs a single or small number of related commands on a circuit design. For example, the EDA tasks may include: an elaborate script, a synthesis script, a clock route script, a design-implementation script, a design-optimization script, a design-analysis script, etc. In contrast with operating-system processes, these commands operate on a circuit design. Note that each EDA task may involve multiple operating-system processes.

Moreover, a step flow (or a sub-block flow) is defined as a collection or sequence of inter-coupled EDA tasks that operate on the circuit design. In general, step flows are grouped into functional areas such as: synthesis, floor planning, place and route, chip finishing, etc. Note that a step flow is always 'flat.'

Additionally, a block flow is defined as a collection or sequence of inter-coupled step flows that complete at least a portion of the circuit design. Note that block flows can be hierarchical flows (e.g., flows that have a treed structure with a root level and one or more dependent branches). Furthermore, many circuit designs are specified as a sequence of inter-coupled blocks (and their associated flows).

The EDA software can include foundry-ready technology, designs and libraries, such as EDA tool scripts and flow templates that are preconfigured based at least in part on the requirements associated with particular semiconductor manufacturers or manufacturing facilities, and which are already validated. In addition, the EDA software may provide preconfigured foundry-specific checklists and documentation to assist the user in prompt and successful tape-out of the circuit design.

In order to improve product visibility (and, thus, user productivity), the EDA software may also support the generation of on-demand management reports, including real-time queries during the execution of a user-configurable EDA flow. These reports may be user configured, and may allow the user to monitor performance metrics, such as: area utilization, clock speed, power consumption, and/or any errors that occur during execution of the user-configurable EDA flow.

While assessing the sub-circuit via computer modeling of its functionality, various problems may be identified. Some of these problems may only come to the fore as aspects of the physical implementation are brought into the modeling context. Resolution of these problems may require the designer to re-work or refine a sub-module of the sub-circuit. Furthermore, such refinement may require multiple iterations of the sub-module in evaluation of the changes before the optimal solution is identified. Accordingly, the time associated with each iteration is of significance.

In order to accomplish the refinement of a sub-module in the current state of the art there are two options available to the designer; each has significant drawbacks:

1) Create a corresponding sub-module in the physical implementation; that is, create a level of physical hierarchy for the sub-module. This adds significant complexity to the design flow while also creating additional challenges in accomplishing the desired performance for the circuit.

2) In the absence of creating a corresponding level of physical hierarchy for the sub-module the designer is forced to rebuild the larger sub-circuit that contains the sub-module. This sub-circuit must meet two criteria:

a. It must contain the sub-module in its entirety, and b. There must already exist in the physical implementation a level of physical hierarchy for the sub-circuit.

Thus, the designer may have to progress a significant distance up the hierarchy of the design to find such a sub-circuit. As a result, a much larger design may need to be re-built, resulting in longer than necessary run times while also potentially opening the door for the introduction of other design problems and user error.

In accordance with an embodiment of the current invention these difficulties are alleviated by enabling sub-module physical synthesis independent of physical hierarchy. Only the sub-module is rebuilt with no additional physical hierarchy and no additional physical hierarchy is added. This is fundamentally accomplished by the introduction of two new concepts that together, and when applied in the context of known capabilities and methodologies, are the enabling factors. These two new concepts are the "porosity DEF" and "inverse ILM" which are described in detail in the following discussion.

Context Setting

In order to perform physical synthesis on any circuit there are fundamentally three key pieces of information that must be supplied:

1) Description of the connectivity and functionality of the circuit (i.e. the netlist).

2) Timing and logical constraints to capture the parametric measures of the functionality.

3) Physical constraints.

Each of these must be supplied for sub-module physical refinement that is the context for this discussion.

Figure 2:
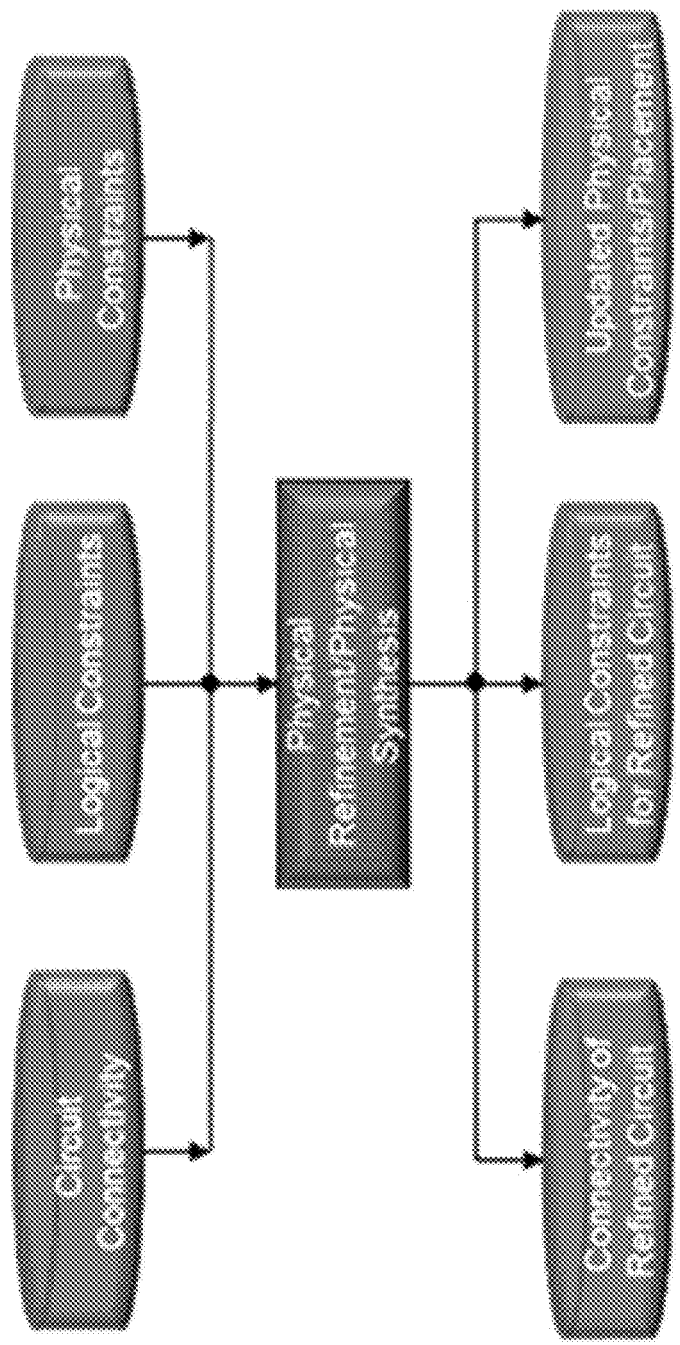
FIG. 2 illustrates exemplary primary inputs and outputs of general physical refinement/physical synthesis.

FIG. 2 illustrates exemplary primary inputs and outputs of general physical refinement/physical synthesis. In order for proper sub-module physical refinement to be done, certain information from the larger sub-circuit is also required. (This larger sub-circuit is also known as the parent design.) All three fundamental inputs noted above—circuit connectivity description, logical constraints, and physical constraints—are needed for selected portions of the parent design.

The sub-module physical refinement flow represented in this embodiment focuses on obtaining these three fundamental pieces for both the parent design and the subject sub-module.

Figure 3:
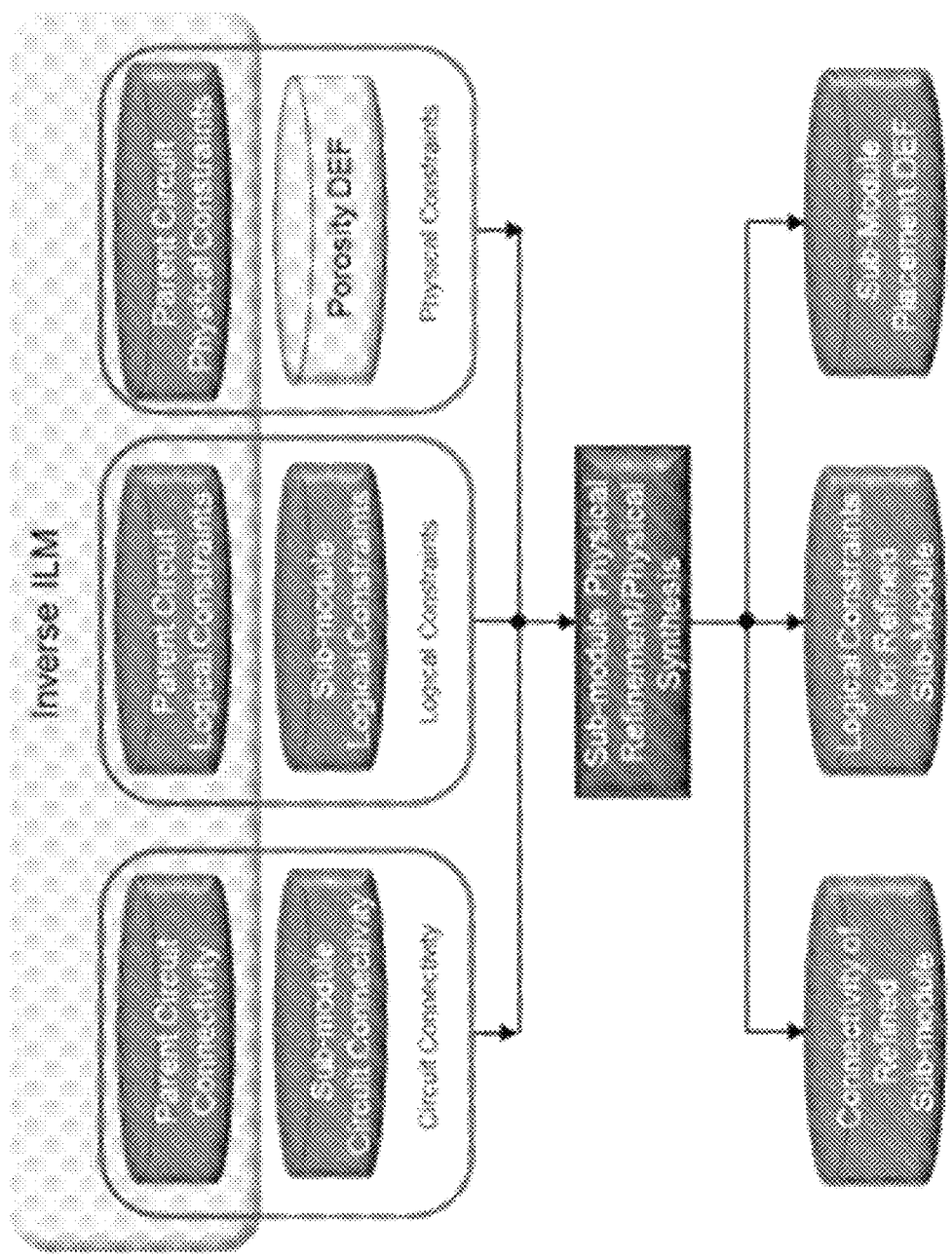
FIG. 3 illustrates exemplary primary inputs and outputs for sub-module physical refinement/physical synthesis as presented in this embodiment.

FIG. 3 illustrates exemplary primary inputs and outputs for sub-module physical refinement/physical synthesis as presented in this embodiment. FIG. 3 shows how the "inverse ILM" and "porosity DEF" contribute to supplying these necessary inputs. In the flow encompassed by this invention, timing and logical constraints for the sub-module are available via existing capabilities in the Synopsys software tools. No new capabilities need be developed for the initial embodiment of this invention. However, there may be a desire for some changes and enhancements in these capabilities to further refine and improve this embodiment if it were to be advanced.

Since no new capabilities are initially required for the creation of the logical constraints for the sub-module, the technical divulgence of this invention will start with the physical constraints and the new concepts of "porosity DEF" and "inverse ILM". Note that the "inverse ILM" concept blurs the lines between the netlist, logical, and physical constraints as it encompasses elements of all three.

In order to accomplish the sub-module physical synthesis that is the topic of this discussion, the absence of physical constraints and representation of physical context are the key capabilities missing in the current state of the art. Resolving these deficiencies is at the heart of this invention and is the enabling factor for the larger flow.

In the context for this invention, there already exists a level of physical hierarchy for the larger sub-circuit parent design. Accordingly, physical constraints exist for the parent. They are captured in the DEF file and ASCII TCL scripting.

Figure 4:
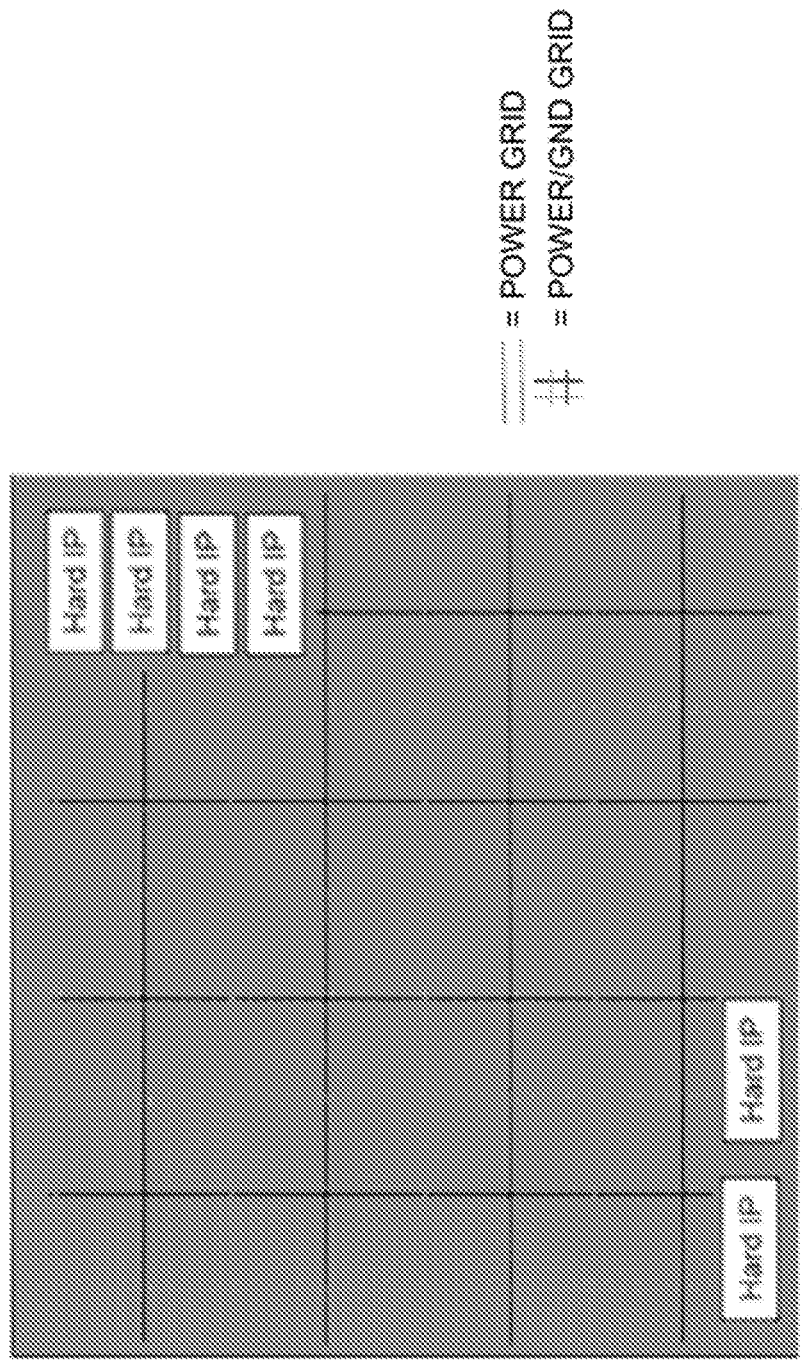
FIG. 4 illustrates a parent floorplan DEF.

Prior to initial physical synthesis of the parent, the DEF file captures what may be referred to as the floorplan constraints (i.e. cell rows, hard IP macro locations and halos, power grid, placement blockages, etc.). For illustrative purposes, a simple, graphical representation of this floorplan DEF for the parent is given in FIG. 4.

Figure 5:
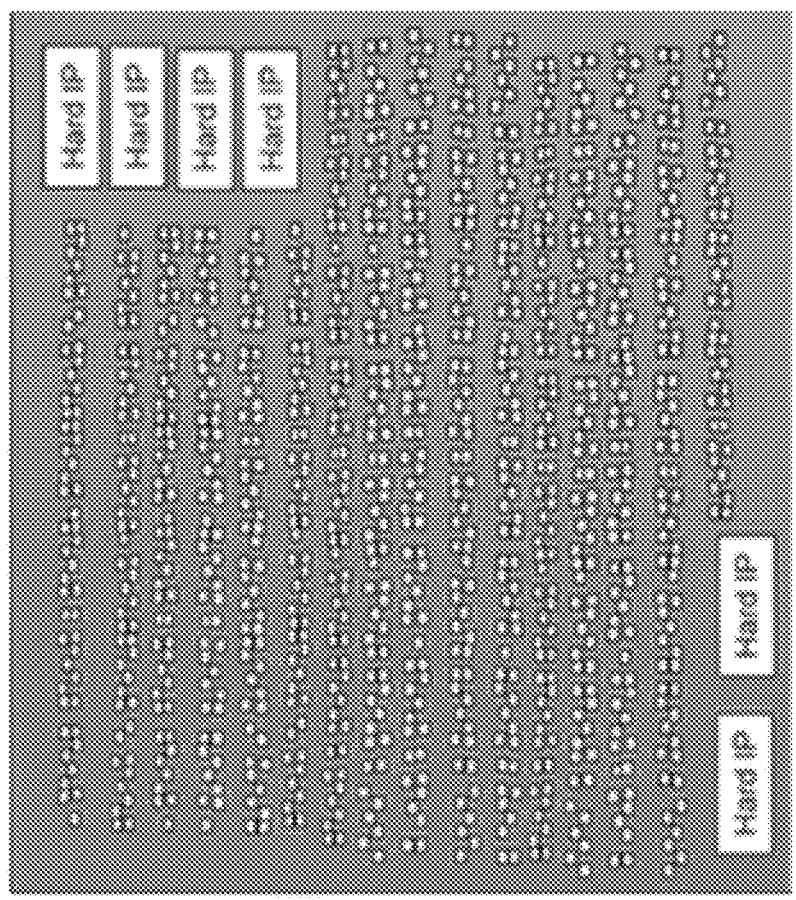
FIG. 5 presents a graphical illustration of a post-placement DEF file where the cell rows and PG grid have been omitted for clarity.

After physical synthesis of the parent, the placement of the cells comprising the netlist is also contained in the DEF. This post-placement DEF file is represented in FIG. 5. FIG. 5 presents a graphical illustration of a post-placement DEF file where the cell rows and PG grid have been omitted for clarity. It is from this context that the physical constraints and context for the targeted sub-module (also referred to as the child) are derived. It is desirable for the refinement of the sub-module to be done in this larger context. This invention provides that capability.

Porosity DEF

Figure 6:
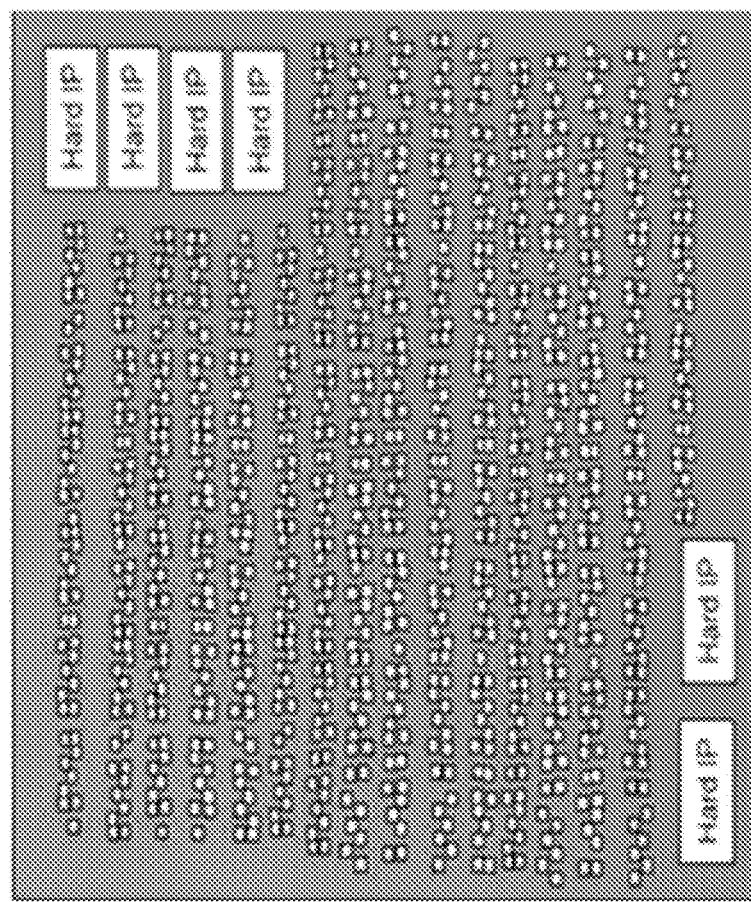
FIG. 6 presents a graphical illustration of the parent DEF file with cells of targeted sub-module highlighted.

When considering the physical context and constraints for the physical synthesis of the targeted sub-module, it would be best if all the cells of the parent could remain in their current placement while allowing for the placement of the cells of the sub-module in the space that remains. This cannot be done in the current state of the art, but is accomplished via the "porosity DEF". Consider a conceptual representation of the fully placed parent circuit as given in FIG. 5. Scattered throughout this placement are the cells of the targeted sub-module. FIG. 6 presents a graphical illustration of the parent DEF file with cells of targeted sub-module highlighted.

Figure 7:
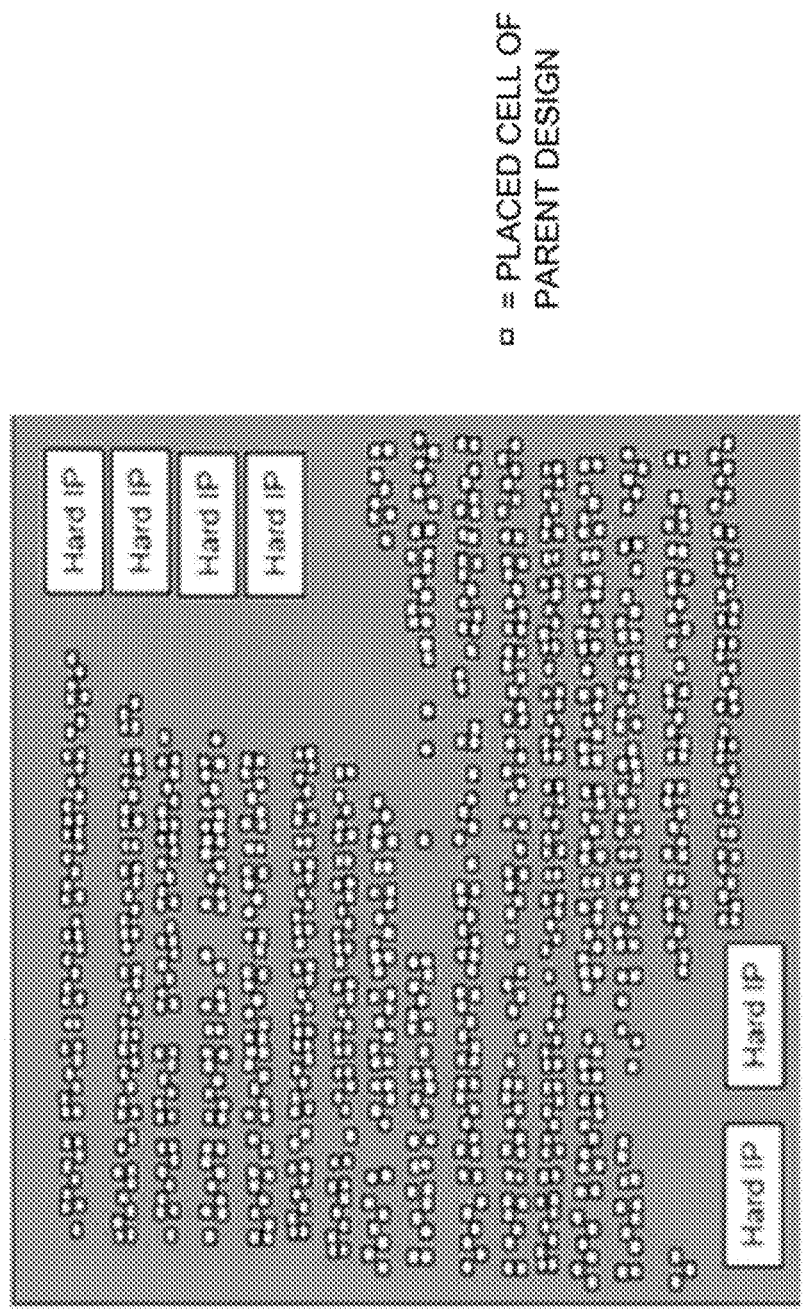
FIG. 7 presents a graphical illustration of porosity DEF.

In the "porosity DEF" the cells of the sub-module are removed, leaving vacant placement sites. These sites, vacated by the removal of the cells of the targeted sub-module, along with the sites that were not used during the physical synthesis of the parent, represent the placement resources available during the subject sub-module physical synthesis. They represent the porosity, or open space, within which the tools can work as they endeavor to place the cells of the newly-refined sub-module. An illustration of a "porosity DEF" is given in FIG. 7. FIG. 7 presents a graphical illustration of porosity DEF. This porosity DEF is saved as it will be needed later in the reconstitution of the parent after the sub-module refinement is complete.

Figure 8:
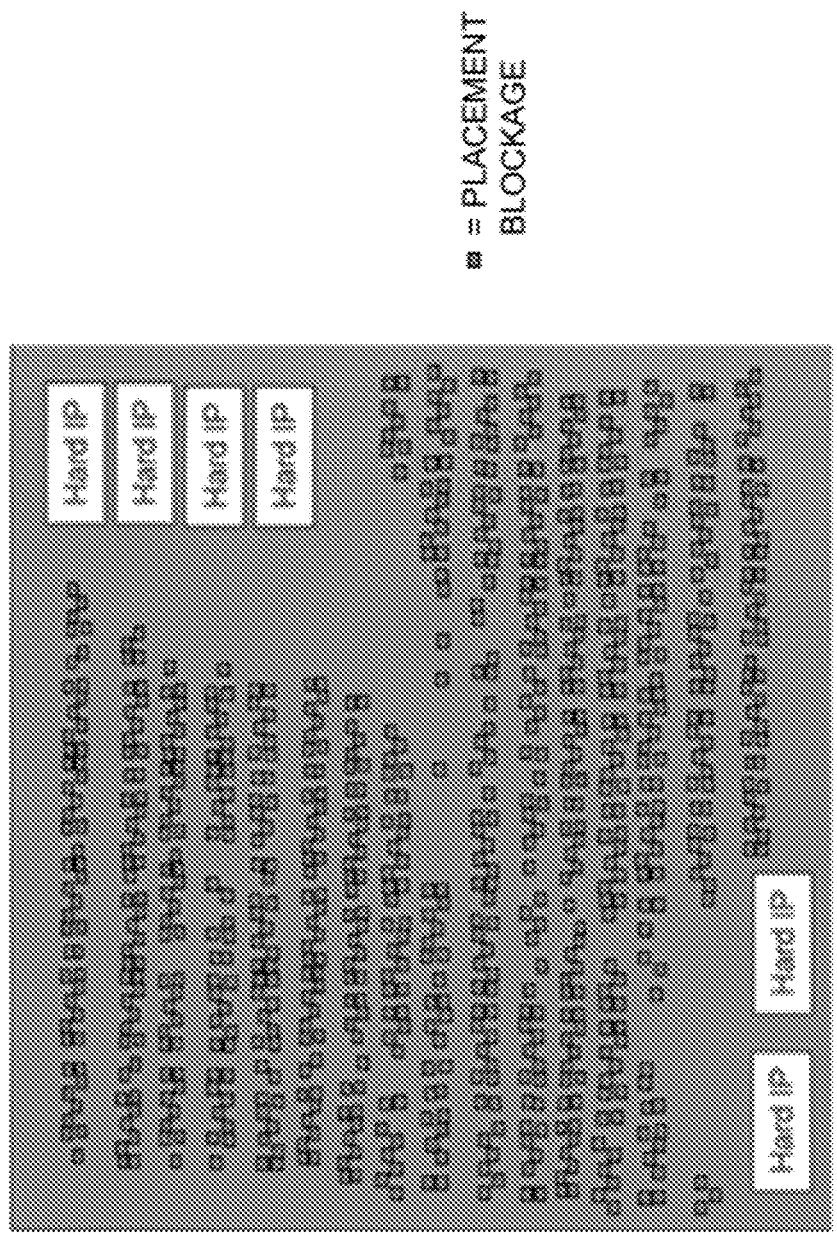
FIG. 8 presents a graphical illustration of placement blockage porosity DEF.

Prior to the actual physical synthesis or refinement of the sub-module, a change is made to the porosity DEF file. Rather than retaining the cells of the parent that are outside of the sub-module as placed cells, these cells are each converted to a placement blockage of the same size and in the same location as the cell itself. Converting the cells of the parent to placement blockages instead of actual DEF instances offers a significant run time improvement for physical synthesis and placement optimization tools. The resulting DEF, referenced as the "placement blockage porosity DEF" is shown in FIG. 8. FIG. 8 presents a graphical illustration of placement blockage porosity DEF.

Inverse ILM

The placement blockage porosity DEF is a powerful concept. However, for accurate refinement of the sub-module, additional information is needed. It is necessary to know information about the cells of the parent design that drive and receive the input and output signals of the targeted sub-module. For example, the location and drive strength of the cells driving the inputs, and the location and gate capacitance of the cells driven by the outputs of the sub-module must be known. Per the description of the placement blockage porosity DEF above, all cells outside of the sub-module are represented as placement blockages and thus this critical information is not available. As a result, the placement blockage porosity DEF must be refined and additional information presented in order to accomplish optimal physical synthesis of the targeted sub-module. This is where the concept of the "inverse ILM" comes into play to represent the necessary elements of the context presented to the sub-module. This context includes the concepts of netlist connectivity as well as logical and physical constraints.

In hierarchical design flows the concept of an ILM (Interface Logic Model) is well understood. This model is intended to capture only the portions of the circuit that are part of the interface which that circuit presents to the larger circuit within which it is instantiated. In concept, ILM models capture the view from the parent circuit looking into the child. The new concept of the "inverse ILM" is the opposite. The "inverse ILM" captures the view from the child looking out to the parent. Just as the ILM captures only the portions of the child that communicate or interface with the parent, so the "inverse ILM" captures only the portions of the parent circuit that communicate with the child.

Figure 9:
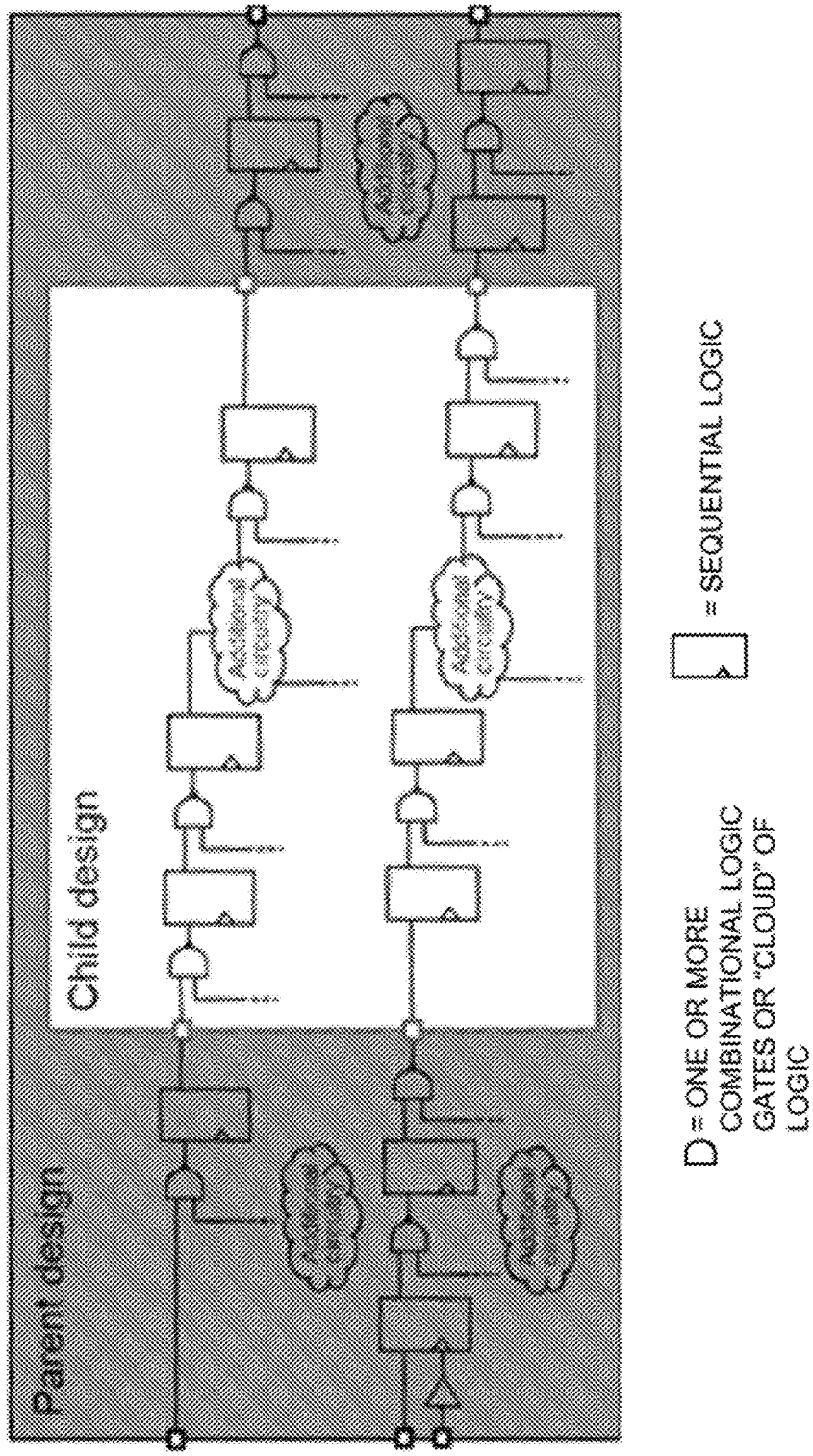
FIG. 9 illustrates a conceptual representation of complete circuitry of parent and child.

These concepts are illustrated in the circuit diagrams that follow. FIG. 9 gives a conceptual representation of the complete circuitry of both the parent and the child.

Figure 10:
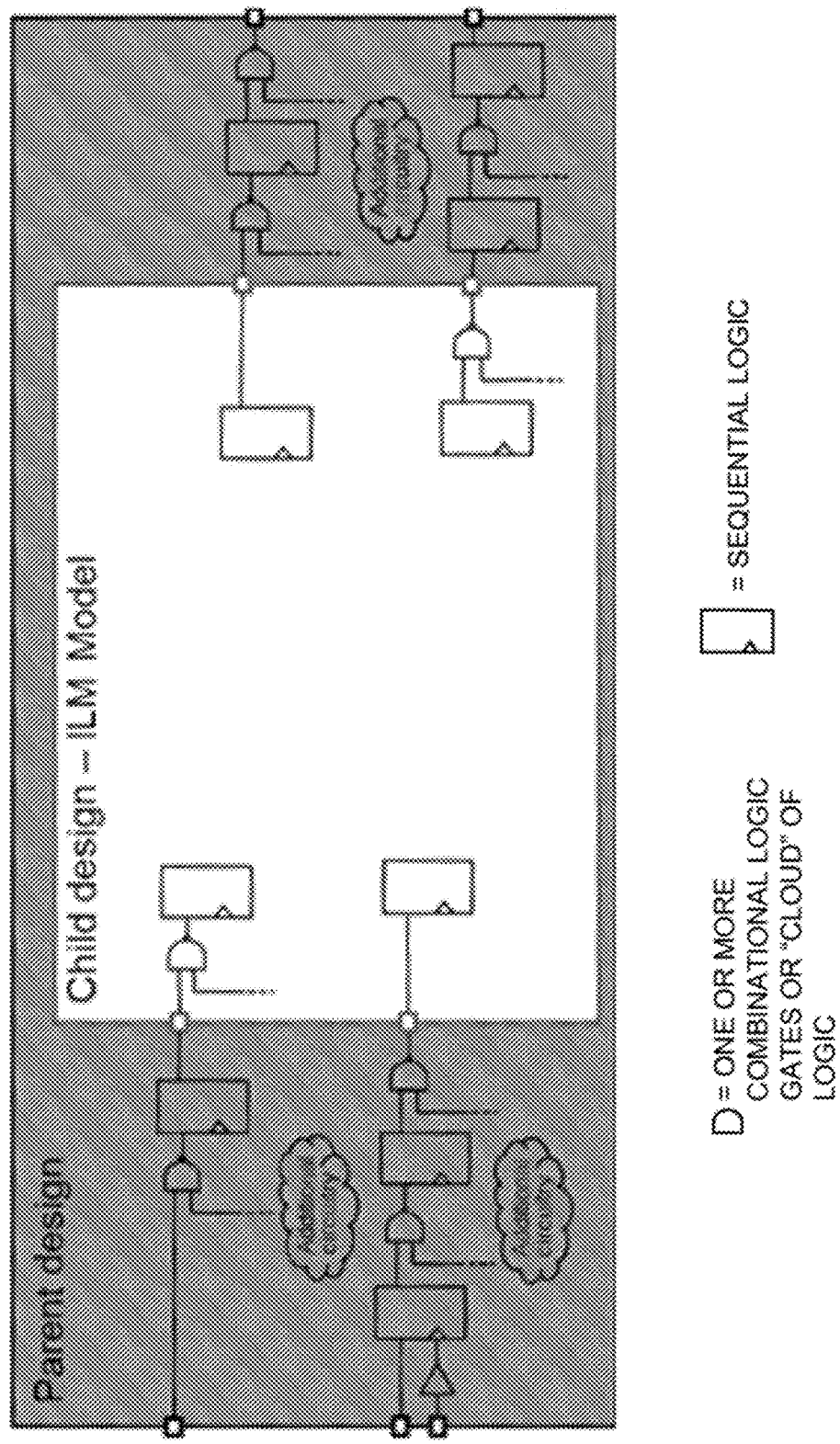
FIG. 10 illustrates an ILM model for child design.

FIG. 10 illustrates an ILM model for child design. In this example, FIG. 10 provides a circuit diagram with the child design represented by an ILM model. It can be seen that only the gates that interface with the parent remain.

Figure 11:
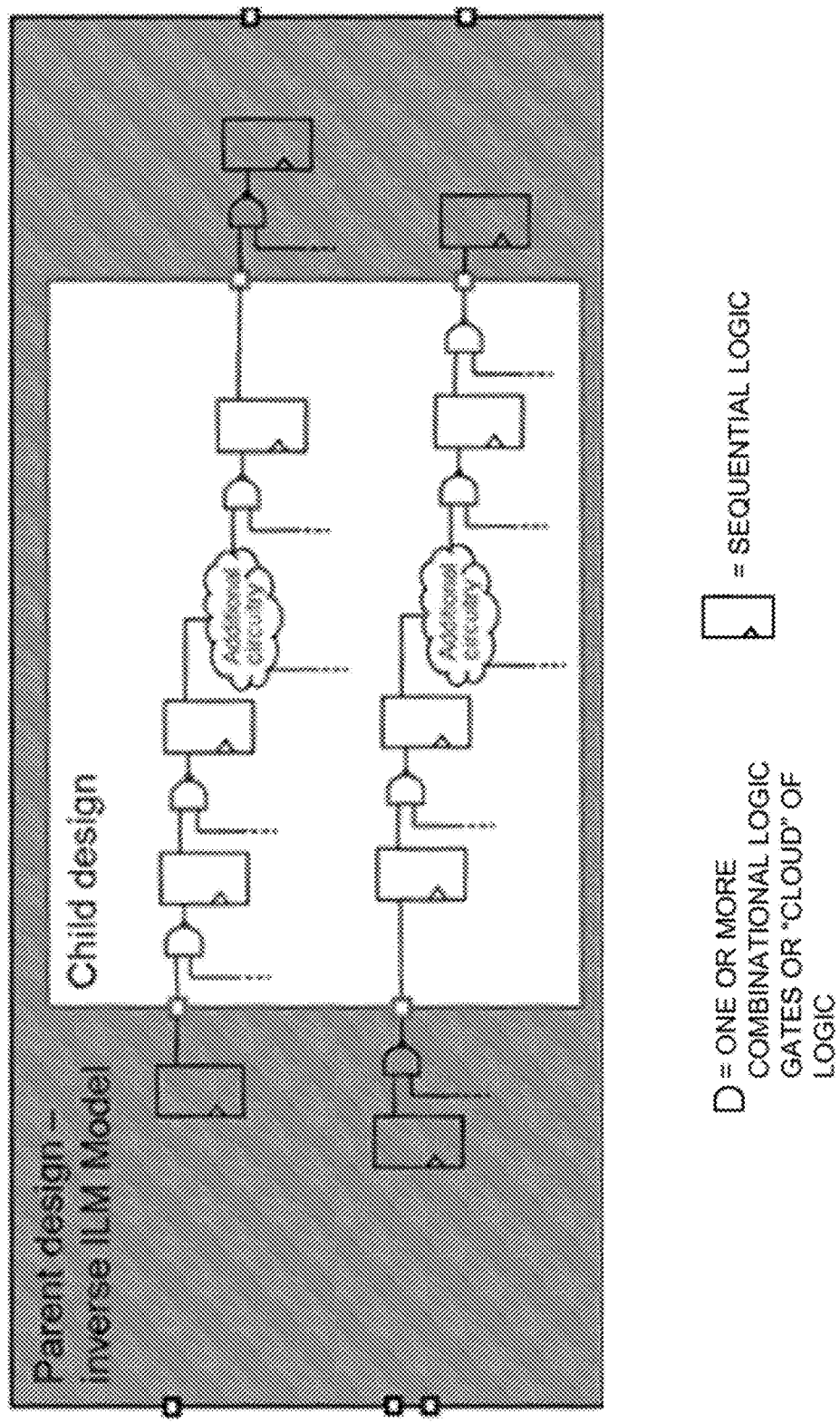
FIG. 11 shows an illustration of an "inverse ILM" model for the parent design.

FIG. 11 shows an illustration of an "inverse ILM" model for the parent design. In this example, FIG. 11 then gives an illustration of the "inverse ILM" concept applied to the parent. Only the cells of the parent that interface with the input and output ports of the child are retained.

The "inverse ILM" thus represents a reduced model for the parent design. In this model, only the cells of the parent that communicate with the child are retained. For the purposes of representing the context for physical refinement of the child, these cells are the only cells of the parent that are needed. The "inverse ILM" captures the three fundamental pieces needed to comprehensively represent these cells for the physical refinement of the child:

1) Description of the connectivity and functionality of the circuit (i.e. the netlist)—The netlist of the parent is reduced to just the interface cells.

2) Timing and logical constraints to capture the parametric measures of the functionality—Only the constraints of the parent design that are pertinent to these cells are retained, along with the comprehensive logical constraints for the child.

3) Physical constraints—The location of and physical constraints associated with the interface cells of the parent are retained.

This reduced model of the parent provides all the information needed from the perspective of the child. Its reduced content significantly improves the run time of the child physical synthesis refinement. In addition, the fact that the rest of the parent remains untouched provides the stability advantages noted earlier—limited opportunity for the introduction of new problems, and reduced opportunity for user error.

Cumulative Physical Constraints of the Porosity DEF and Inverse ILM

As stated earlier, the inverse ILM blurs the lines between the circuit connectivity, logical constraints, and physical constraints as it supplies information about the parent for each of these. In addition, the placement blockage porosity DEF is a key piece in the establishment of physical constraints. It is thus important to consider the novel cumulative physical constraints posed by these two inventions.

As described earlier in FIG. 8, the placement blockage porosity DEF represents all cells outside of the child as placement blockages. It was then stated that additional information pertaining to the interface cells was required and description was made of how this is supplied via the inverse ILM. Specifically, the interface cells of the parent must be identified and their location made known and preserved. It is not sufficient to merely represent them as placement blockages when capturing the physical context and constraints for the physical refinement of the child.

Figure 12:
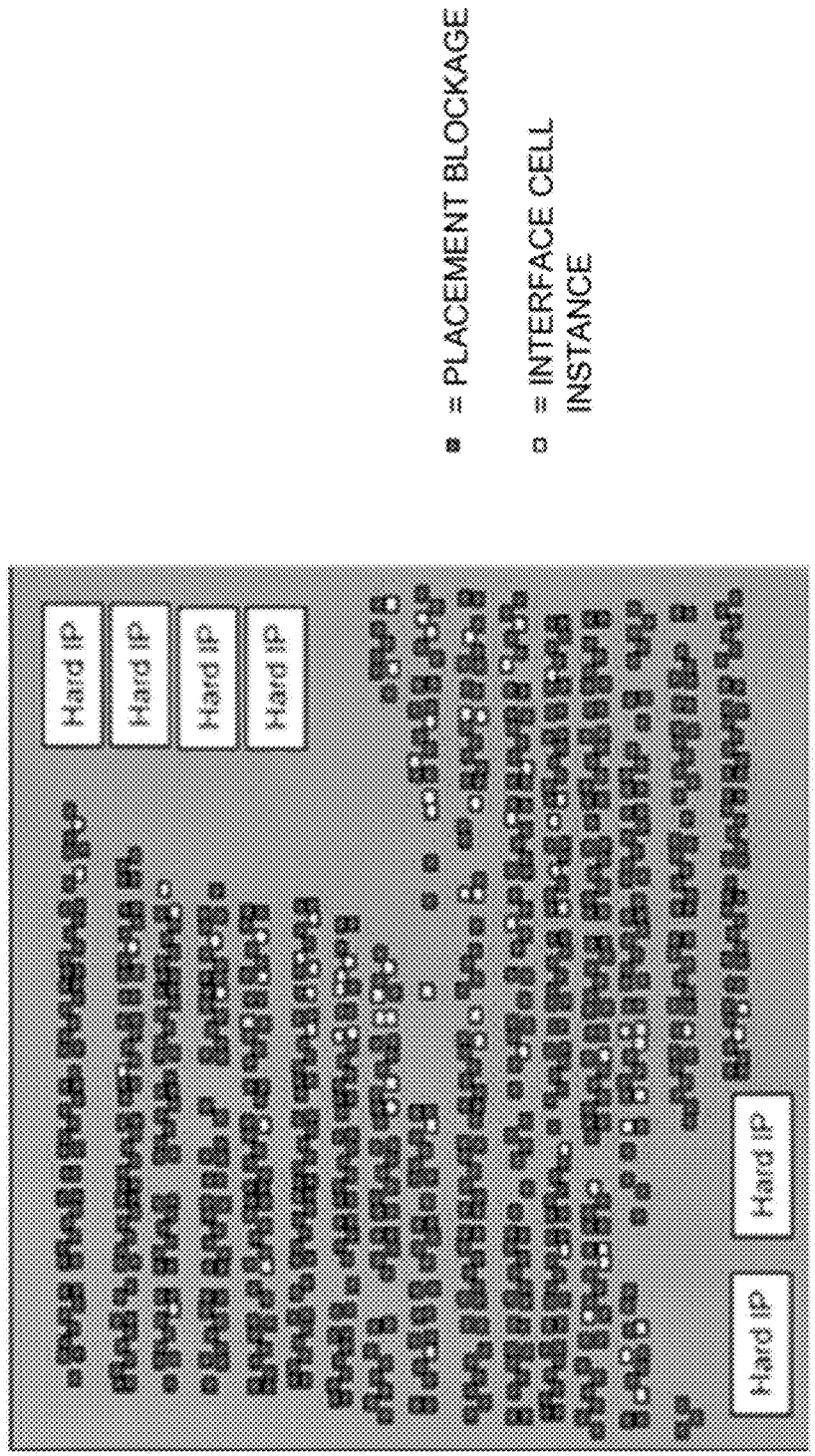
FIG. 12 provides a graphical illustration of the physical context for sub-module refinement.

The finalized physical context for the refinement of the child illustrating the concepts of both the porosity DEF and inverse ILM is given in FIG. 12 below. FIG. 12 provides a graphical illustration of the physical context for sub-module refinement.

This information may be captured via an ASCII DEF file, or, more efficiently, via the in-memory representation of the design in the EDA tool. Note that the interface cells of the parent are no longer represented as placement blockages, but are now actual cell instantiations. (As represeted in FIG. 12, such cells are white). Thus, in providing a physical context for the child, all the cells of the parent are represented as either a placement blockage or an actual cell instance; with only the interface cells retained as actual cell instances.

The Flow

Now that the key supporting inventions of this embodiment have been captured and defined, the overall sub-module physical refinement flow can be considered. In order to perform sub-module physical refinement there must exist a netlist, logical constraints, and physical constraints for both the parent and the child. Each of these will be covered in the discussion that follows.

The starting context for this flow is a fully synthesized and placed design; this placement may be fully legalized, or it may be virtual placement. Thus, there exists a complete structural netlist, logical constraints, and physical constraints covering both the parent and the child. At this stage in the overall design development, the designer typically has need to refine a sub-module of that parent, and could turn to this flow for a solution rather than incurring the undesirable affects associated with the current state of the art noted earlier.

Figure 13:
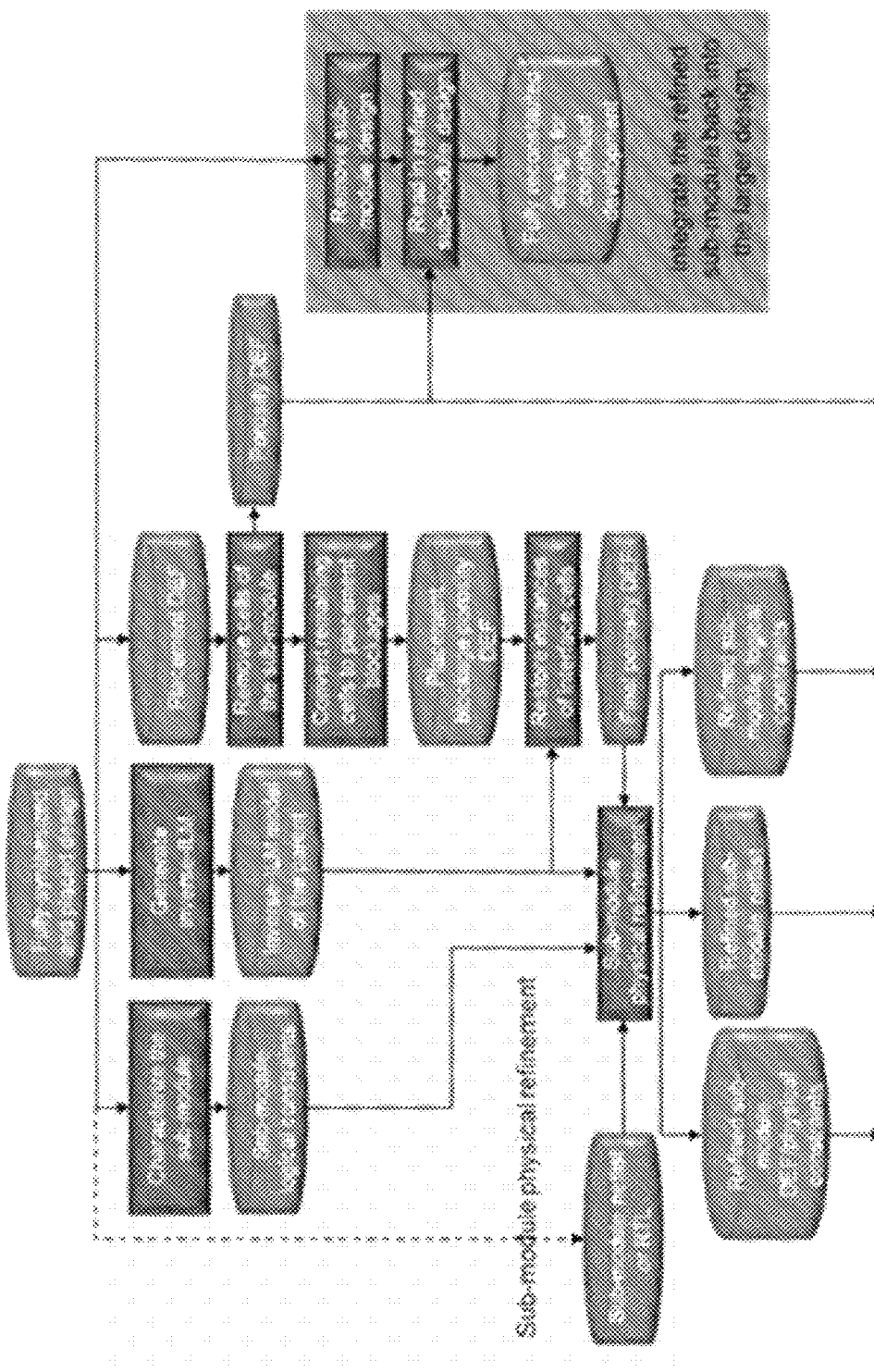
FIG. 13 illustrates an embodiment of a representative overall sub-module physical refinement flow.

FIG. 13 illustrates an embodiment of a representative overall sub-module physical refinement flow.

As can be seen from the flow diagram and discussion above, the reduced netlist, logical constraints and physical constraints for the parent are captured in the inverse-ILM model.

The netlist for the current version of the sub-module can be obtained from the fully synthesized design which is the input to this flow. In addition, the fully synthesized design can be characterized in order to obtain the logical constraints for the sub-module. Both of these capabilities are available in the current state of the art. Note that this sub-module netlist and these sub-module logical constraints represent the current version of the child and typically would be changed in order to capture the parameters of the refinement intended for the sub-module. These files may be edited directly, or a newer version may be inserted at this point. As long as the interface to the parent remains the same any changes to these files can be processed and properly assessed.

The physical context and constraints for the sub-module are supplied via the final porosity DEF. The concepts of this file have been covered above. In addition to that covered above, the user may change or supplement this information as desired.

With these files in place, the designer is now enabled to perform sub-module physical refinement using the Synopsys synthesis and physical implementation EDA tools. Once the sub-module physical refinement is complete, the sub-module must be integrated back into the parent design for further analysis and progression of physical implementation.

The handling of the netlist and logical constraints in this matter is easily accomplished in the current state of the art.

The handling of the physical constraints and placement of cells of both the sub-module and its parent requires some attention. The placement of every cell in the larger design must be accounted for at this point in the flow. Per FIG. 7 above, the porosity DEF captures the general physical constraints and placement of all cells outside of the targeted sub-module. Then, per FIG. 13, the sub-module DEF resulting from the sub-module physical refinement captures the general physical constraints and placement of the cells belonging to the sub-module. These two files collectively represent all the cells of the design, along with other physical constraints, and are used to reconstitute the parent design with the refined sub-module.

With those files in place, the parent sub-circuit design is fully reconstituted and ready for continued development.

Additional Applications

The flow represented herein would most commonly be applied to physical synthesis of a sub-module. However, it need not be limited to such. It is equally viable for any sub-module physical refinement of a placed design (i.e. consider the optimization capabilities available in ICC, e.g. psynopt or clock_opt).

As noted earlier, these concepts and flow may also be applied—and possibly more potently so—as an ECO flow to minimize the impact of changes needed or identified later in the development of the design.

The general concepts applied here for targeted netlist and placement refinement may also be employed at later stages of design development (e.g. clock tree synthesis, routing, etc.).

Conclusion

The above description is presented to enable any person skilled in the art to make and use the embodiments. Various modifications to the disclosed embodiments will be readily apparent to those skilled in the art, and the general principles defined herein are applicable to other embodiments and applications without departing from the spirit and scope of the present disclosure. Thus, the present invention is not limited to the embodiments shown, but is to be accorded the widest scope consistent with the principles and features disclosed herein.

The data structures and code described in this disclosure can be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described in this disclosure include, but are not limited to, application-specific integrated circuits (ASICs), field-programmable gate arrays (FPGAs), dedicated or shared processors, and/or other hardware modules or apparatuses now known or later developed.

The methods and processes described in this disclosure can be partially or fully embodied as code and/or data stored in a computer-readable storage medium or device, so that when a computer system reads and executes the code and/or data, the computer system performs the associated methods and processes. The methods and processes can also be partially or fully embodied in hardware modules or apparatuses, so that when the hardware modules or apparatuses are activated, they perform the associated methods and processes. Note that the methods and processes can be embodied using a combination of code, data, and hardware modules or apparatuses.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

Figure 14:
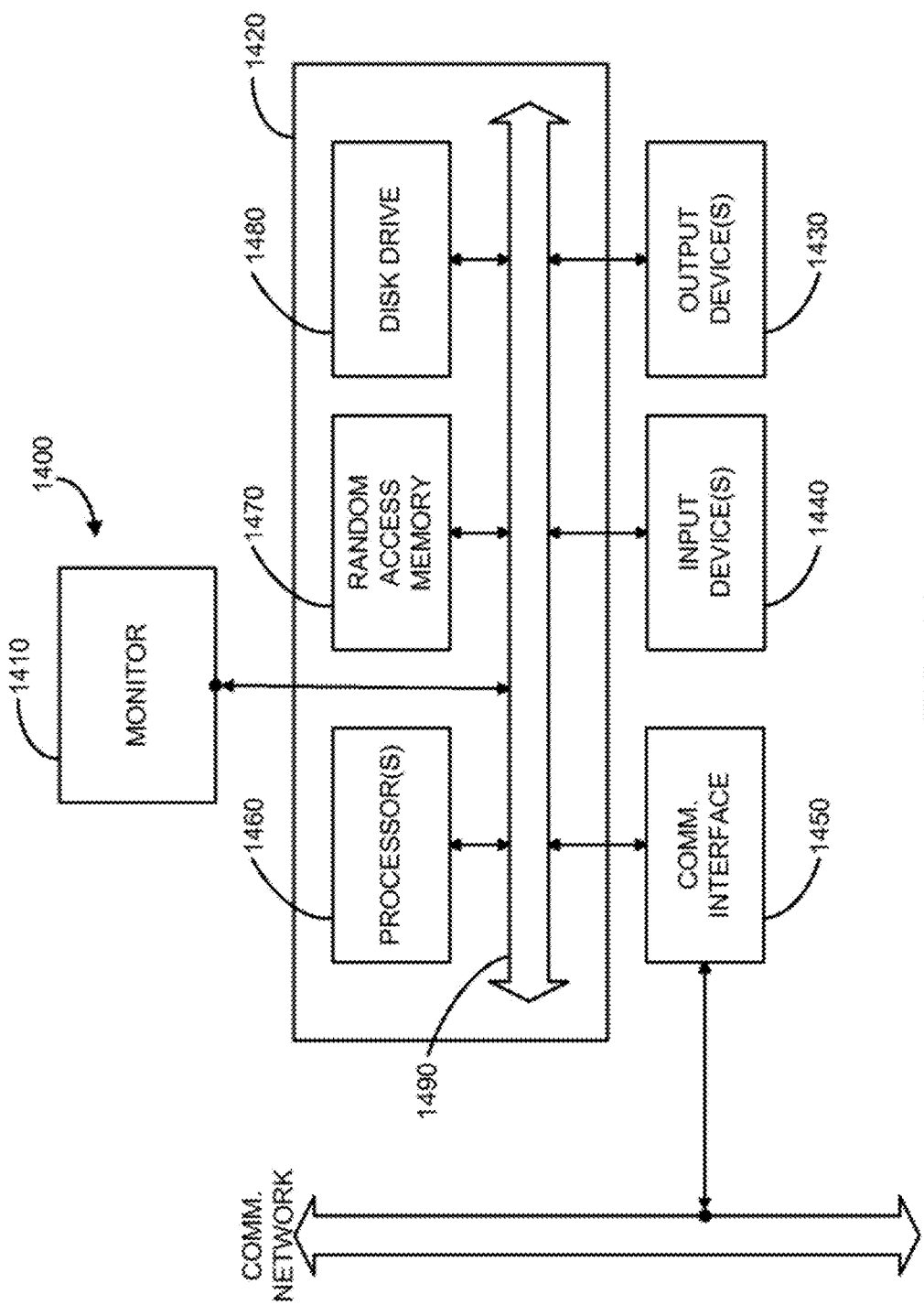
FIG. 14 is a simplified block diagram of a computer system 1400 that may incorporate embodiments of the present invention.

FIG. 14 is a simplified block diagram of a computer system 1400 that may incorporate embodiments of the present invention. FIG. 14 is merely illustrative of an embodiment incorporating the present invention and does not limit the scope of the invention as recited in the claims. One of ordinary skill in the art would recognize other variations, modifications, and alternatives.

In one embodiment, computer system 1400 typically includes a monitor 1410, a computer 1420, user output devices 1430, user input devices 1440, communications interface 1450, and the like.

As shown in FIG. 14, computer 1420 may include a processor(s) 1460 that communicates with a number of peripheral devices via a bus subsystem 1490. These peripheral devices may include user output devices 1430, user input devices 1440, communications interface 1450, and a storage subsystem, such as random access memory (RAM) 1470 and disk drive 1480.

User input devices 1430 include all possible types of devices and mechanisms for inputting information to computer system 1420. These may include a keyboard, a keypad, a touch screen incorporated into the display, audio input devices such as voice recognition systems, microphones, and other types of input devices. In various embodiments, user input devices 1430 are typically embodied as a computer mouse, a trackball, a track pad, a joystick, wireless remote, drawing tablet, voice command system, eye tracking system, and the like. User input devices 1430 typically allow a user to select objects, icons, text and the like that appear on the monitor 1410 via a command such as a click of a button or the like.

User output devices 1440 include all possible types of devices and mechanisms for outputting information from computer 1420. These may include a display (e.g., monitor 1410), non-visual displays such as audio output devices, etc.

Communications interface 1450 provides an interface to other communication networks and devices. Communications interface 1450 may serve as an interface for receiving data from and transmitting data to other systems. Embodiments of communications interface 1450 typically include an Ethernet card, a modem (telephone, satellite, cable, ISDN), (asynchronous) digital subscriber line (DSL) unit, FireWire interface, USB interface, and the like. For example, communications interface 1450 may be coupled to a computer network, to a FireWire bus, or the like. In other embodiments, communications interfaces 1450 may be physically integrated on the motherboard of computer 1420, and may be a software program, such as soft DSL, or the like.

In various embodiments, computer system 1400 may also include software that enables communications over a network such as the HTTP, TCP/IP, RTP/RTSP protocols, and the like. In alternative embodiments of the present invention, other communications software and transfer protocols may also be used, for example IPX, UDP or the like.

In some embodiment, computer 1420 includes one or more Xeon microprocessors from Intel as processor(s) 1460. Further, one embodiment, computer 1420 includes a UNIX-based operating system.

RAM 1470 and disk drive 1480 are examples of tangible media configured to store data such as embodiments of the present invention, including executable computer code, human readable code, or the like. Other types of tangible media include floppy disks, removable hard disks, optical storage media such as CD-ROMS, DVDs and bar codes, semiconductor memories such as flash memories, read-only-memories (ROMS), battery-backed volatile memories, networked storage devices, and the like. RAM 1470 and disk drive 1480 may be configured to store the basic programming and data constructs that provide the functionality of the present invention.

Software code modules and instructions that provide the functionality of the present invention may be stored in RAM 1470 and disk drive 1480. These software modules may be executed by processor(s) 1460. RAM 1470 and disk drive 1480 may also provide a repository for storing data used in accordance with the present invention.

RAM 1470 and disk drive 1480 may include a number of memories including a main random access memory (RAM) for storage of instructions and data during program execution and a read only memory (ROM) in which fixed instructions are stored. RAM 1470 and disk drive 1480 may include a file storage subsystem providing persistent (non-volatile) storage for program and data files. RAM 1470 and disk drive 1480 may also include removable storage systems, such as removable flash memory.

Bus subsystem 1490 provides a mechanism for letting the various components and subsystems of computer 1420 communicate with each other as intended. Although bus subsystem 1490 is shown schematically as a single bus, alternative embodiments of the bus subsystem may utilize multiple busses.

FIG. 14 is representative of a computer system capable of embodying the present invention. It will be readily apparent to one of ordinary skill in the art that many other hardware and software configurations are suitable for use with the present invention. For example, the computer may be a desktop, portable, rack-mounted or tablet configuration. Additionally, the computer may be a series of networked computers. Further, the use of other micro processors are contemplated, such as Pentium™ or Itanium™ microprocessors; Opteron™ or AthlonXP™ microprocessors from Advanced Micro Devices, Inc; and the like. Further, other types of operating systems are contemplated, such as Windows®, WindowsXP®, WindowsNT®, or the like from Microsoft Corporation, Solaris from Sun Microsystems, LINUX, UNIX, and the like. In still other embodiments, the techniques described above may be implemented upon a chip or an auxiliary processing board.

Various embodiments of the present invention can be implemented in the form of logic in software or hardware or a combination of both. The logic may be stored in a computer readable or machine-readable storage medium as a set of instructions adapted to direct a processor of a computer system to perform a set of steps disclosed in embodiments of the present invention. The logic may form part of a computer program product adapted to direct an information-processing device to perform a set of steps disclosed in embodiments of the present invention. Based on the disclosure and teachings provided herein, a person of ordinary skill in the art will appreciate other ways and/or methods to implement the present invention.

The specification and drawings are, accordingly, to be regarded in an illustrative rather than a restrictive sense. It will, however, be evident that various modifications and changes may be made thereunto without departing from the broader spirit and scope of the invention as set forth in the claims. In addition, the technique and system of the present invention is suitable for use with a wide variety of EDA tools and methodologies for designing, testing, and/or manufacturing integrated circuits or other electronic devices. The scope of the invention should, therefore, be determined not with reference to the above description, but instead should be determined with reference to the pending claims along with their full scope or equivalents.

Various embodiments of any of one or more inventions whose teachings may be presented within this disclosure can be implemented in the form of logic in software, firmware, hardware, or a combination thereof. The logic may be stored in or on a machine-accessible memory, a machine-readable article, a tangible computer-readable medium, a computer-readable storage medium, or other computer/machine-readable media as a set of instructions adapted to direct a central processing unit (CPU or processor) of a logic machine to perform a set of steps that may be disclosed in various embodiments of an invention presented within this disclosure. The logic may form part of a software program or computer program product as code modules become operational with a processor of a computer system or an information-processing device when executed to perform a method or process in various embodiments of an invention presented within this disclosure. Based on this disclosure and the teachings provided herein, a person of ordinary skill in the art will appreciate other ways, variations, modifications, alternatives, and/or methods for implementing in software, firmware, hardware, or combinations thereof any of the disclosed operations or functionalities of various embodiments of one or more of the presented inventions.

The disclosed examples, implementations, and various embodiments of any one of those inventions whose teachings may be presented within this disclosure are merely illustrative to convey with reasonable clarity to those skilled in the art the teachings of this disclosure. As these implementations and embodiments may be described with reference to exemplary illustrations or specific figures, various modifications or adaptations of the methods and/or specific structures described can become apparent to those skilled in the art. All such modifications, adaptations, or variations that rely upon this disclosure and these teachings found herein, and through which the teachings have advanced the art, are to be considered within the scope of the one or more inventions whose teachings may be presented within this disclosure. Hence, the present descriptions and drawings should not be considered in a limiting sense, as it is understood that an invention presented within a disclosure is in no way limited to those embodiments specifically illustrated.

Accordingly, the above description and any accompanying drawings, illustrations, and figures are intended to be illustrative but not restrictive. The scope of any invention presented within this disclosure should, therefore, be determined not with simple reference to the above description and those embodiments shown in the figures, but instead should be determined with reference to the pending claims along with their full scope or equivalents.

What is claimed is:

1. A computer-implemented method for modifying a physical layout of an electronic circuit design comprising a plurality of sub-modules each including a plurality of cells, the method comprising:
   identifying, using the computer, at least a first sub-module of the plurality of sub-modules requiring modification, said at least first sub-module included in a first sub-circuit of the physical layout;
   converting, using the computer, a remaining ones of the plurality of sub modules to a plurality of placement blockages, each placement blockage representing only physical constraints imposed by each of the plurality of sub-modules;
   identifying, using the computer, within the remaining ones of the plurality of sub-modules a plurality of interface cells that are only those cells that either supply at least one signal to or receive at least one signal from cells of the at least first sub-module;
   converting, using the computer, each of the plurality of interface cells from a placement blockage to an actual cell instance; and
   replacing a layout of the at least first sub-module with a modified layout in the first sub-circuit and in accordance with the plurality of actual cell instances.

2. the computer-implemented method of claim 1 further comprising:
   retaining connectivity data between the plurality of actual cell instances disposed in the remaining ones of the plurality of sub-modules and the cells disposed in the at least first sub-module.

3. The computer-implemented method of claim 1 further comprising:
   retaining logical constraints associated with the plurality of actual cell instances disposed in the remaining ones of the plurality of sub-modules.

4. The computer-implemented method of claim 1 further comprising:
   retaining timing information associated with the plurality of actual cell instances disposed in the remaining ones of the plurality of sub-modules.

5. The computer-implemented method of claim 1 further comprising:
   retaining data representative of physical constraints and locations of the plurality of actual cell instances disposed in the remaining ones of the plurality of sub-modules.

6. A non-transitory computer-readable storage medium comprising instructions for modifying a physical layout of an electronic circuit design comprising a plurality of sub-modules each including a plurality of cells, the instructions when executed by a processor causing the processor to:
   identify at least a first sub-module of the plurality of sub-modules requiring modification, said at least first sub-module included in a first sub-circuit of the physical layout;
   convert all remaining ones of the plurality of sub-modules to a plurality of placement blockages, each placement blockage representing only physical constraints imposed by each of the plurality of sub-modules;
   identify within the remaining ones of the plurality of sub-modules a plurality of interface cells that are only those cells that either supply at least one signal to or receive at least one signal from cells of the at least first sub-module;
   convert each of the plurality of interface cells from a placement blockage to an actual cell instance; and
   replace a layout of the first sub-module with a modified layout in the first sub-circuit and in accordance with the plurality of actual cell instances.

7. The non-transitory computer-readable storage medium of claim 6 wherein said instructions further cause the processor to:
   retain connectivity data between the plurality of actual cell instances disposed in the remaining ones of the plurality of sub-modules and the cells disposed in the at least first sub-module.

8. The non-transitory computer-readable storage medium of claim 6 wherein said instructions further cause the processor to:
   retain logical constraints associated with the plurality of actual cell instances disposed in the remaining ones of the plurality of sub-modules.

9. The non-transitory computer-readable storage medium of claim 6 wherein said instructions further cause the processor to:
   retain timing information associated with the plurality of actual cell instances disposed in the remaining ones of the plurality of sub-modules.

10. The non-transitory computer-readable storage medium of claim 6 wherein said instructions further cause the processor to:
   retain physical constraints and locations of the plurality of actual cell instances disposed in the remaining ones of the plurality of sub-modules.

* * * * *